United States Patent [19]

Cheng

[11] Patent Number: 5,241,503
[45] Date of Patent: Aug. 31, 1993

[54] DYNAMIC RANDOM ACCESS MEMORY WITH IMPROVED PAGE-MODE PERFORMANCE AND METHOD THEREFOR HAVING ISOLATOR BETWEEN MEMORY CELLS AND SENSE AMPLIFIERS

[75] Inventor: Lik T. Cheng, Austin, Tex.

[73] Assignee: Motorola, Inc., Schaumburg, Ill.

[21] Appl. No.: 660,066

[22] Filed: Feb. 25, 1991

[51] Int. Cl.⁵ .............................. G11C 7/00; G11C 8/00
[52] U.S. Cl. .................................... 365/205; 365/208; 365/190; 365/189.05; 365/238.5
[58] Field of Search ............... 365/205, 208, 207, 190, 365/154, 189.05, 203, 189.01, 238.5, 235

[56] References Cited

U.S. PATENT DOCUMENTS

| | | | |
|---|---|---|---|
| 3,736,573 | 5/1973 | Blount et al. | 365/154 |
| 4,102,512 | 9/1978 | Arzubi et al. | 365/230.03 |
| 4,351,034 | 9/1982 | Eaton et al. | 365/205 |
| 4,716,320 | 12/1987 | McAdams | 365/205 |
| 4,804,871 | 2/1989 | Walters | 365/205 |
| 5,031,145 | 7/1991 | Lever | 365/189.05 |
| 5,031,151 | 7/1991 | Fifield et al. | 365/230.06 |
| 5,127,739 | 7/1992 | Duooury et al. | 365/189.11 |

Primary Examiner—William L. Sikes
Assistant Examiner—Toan Tran
Attorney, Agent, or Firm—Maurice Jay Jones; Paul J. Polansky

[57] ABSTRACT

A dynamic random access memory includes memory cells located at intersections of word lines and differential bit line pairs. A row decoder activates a word line in response to a row address. A first sense amplifier coupled to each bit line pair then increases the small differential voltage of the bit line pair to positive and negative power supply voltages. The first sense amplifier is then isolated from the bit lines so that the bit lines may be equalized. The contents of memory cells along the activated word line are stored in corresponding first sense amplifiers, and the memory functions as a by-one static random access memory during successive page-mode cycles. At the end of the page-mode cycles, the first sense amplifiers are recoupled to the bit lines, and second sense amplifiers update modified data and refresh the charge stored in the memory cells. Performance is improved, in at least three ways, including improved write speed, decreased SER by reducing subthreshold leakage, and reduced power consumption.

12 Claims, 6 Drawing Sheets

FIG.1 —PRIOR ART—

DYNAMIC RANDOM ACCESS MEMORY WITH IMPROVED PAGE-MODE PERFORMANCE AND METHOD THEREFOR HAVING ISOLATOR BETWEEN MEMORY CELLS AND SENSE AMPLIFIERS

FIELD OF THE INVENTION

This invention relates generally to memories, and more particularly, to dynamic random access memories which perform page-mode access cycles.

BACKGROUND OF THE INVENTION

Many current computer system designs use data processors capable of performing page-mode memory access cycles. Commercial integrated circuit dynamic random access memories (DRAMs) must be able to perform the page-mode cycles. In a traditional DRAM access cycle, a row address is provided to the DRAM. A signal known as "RAS" becomes active to indicate that a valid row address is present. The DRAM then performs row decoding and activates a word line in response to the row address. Each memory cell coupled to the word line then provides its contents to a corresponding differential bit line pair. Then, a second address known as a column address becomes valid and a signal known as "CAS" indicates that a valid column address is present. The column address is used to select one bit line, and the data represented as a differential voltage on the selected bit line is subsequently provided externally. Each successive cycle includes row decoding followed by column decoding. In page mode, however, after the row address selects a word line, the column address alone is provided in two or more subsequent cycles. Page mode improves system performance by saving the DRAM from the task of repeatedly performing row decoding to select the same word line. Page mode is useful because data stored in the memory is likely to be accessed from adjacent memory addresses. Thus it is advantageous to design DRAMs to maximize performance during page mode.

SUMMARY OF THE INVENTION

Accordingly, there is provided, in one form, a dynamic random access memory comprising a memory cell, isolation means, and first and second sense amplifiers. The memory cell is activated by a word line, and provides a differential voltage to true and complement bit lines in response to a bit stored therein when activated. The isolation means couples the true and complement bit lines to true and complement sense lines, respectively, and isolates the true and complement bit lines from the true and complement sense lines a predetermined time after a start of an access cycle. The first sense amplifier is coupled to the true and complement sense lines, and latches a differential voltage between the true and complement sense lines, in response to the access cycle. The second sense amplifier is coupled to the true and complement bit lines, and latches a differential voltage between the true and complement sense lines in response to a termination of the access cycle.

In another form, there is provided a method of improving a performance of a dynamic random access memory during a page-mode cycle. The dynamic random access memory includes a plurality of memory cells activated by a first word line, and provides a differential voltage to corresponding true and complement bit lines of a plurality of bit line pairs in response to a bit stored therein. The method comprises the steps of providing a bit stored in each memory cell to corresponding true and complement bit lines; latching a differential voltage of each true and complement bit line in a first sense amplifier coupled to corresponding true and complement sense lines, respectively; isolating each true and complement bit line from corresponding true and complement sense lines; equalizing a voltage between each true and complement bit line; coupling the true and complement sense lines corresponding to a selected bit line pair to true and complement input/output signal lines, respectively; recoupling each true and complement sense line to corresponding true and complement bit lines, respectively, at an end of the series of page-mode cycles; and providing voltages to the true and complement bit lines indicative of a logic state stored in the first sense amplifier at the end of the series of page-mode cycles.

These and other objects, features and advantages will be more clearly understood from the following detailed description taken in conjunction with the accompanying drawings.

DETAILED DESCRIPTION OF THE INVENTION

Figure 1:
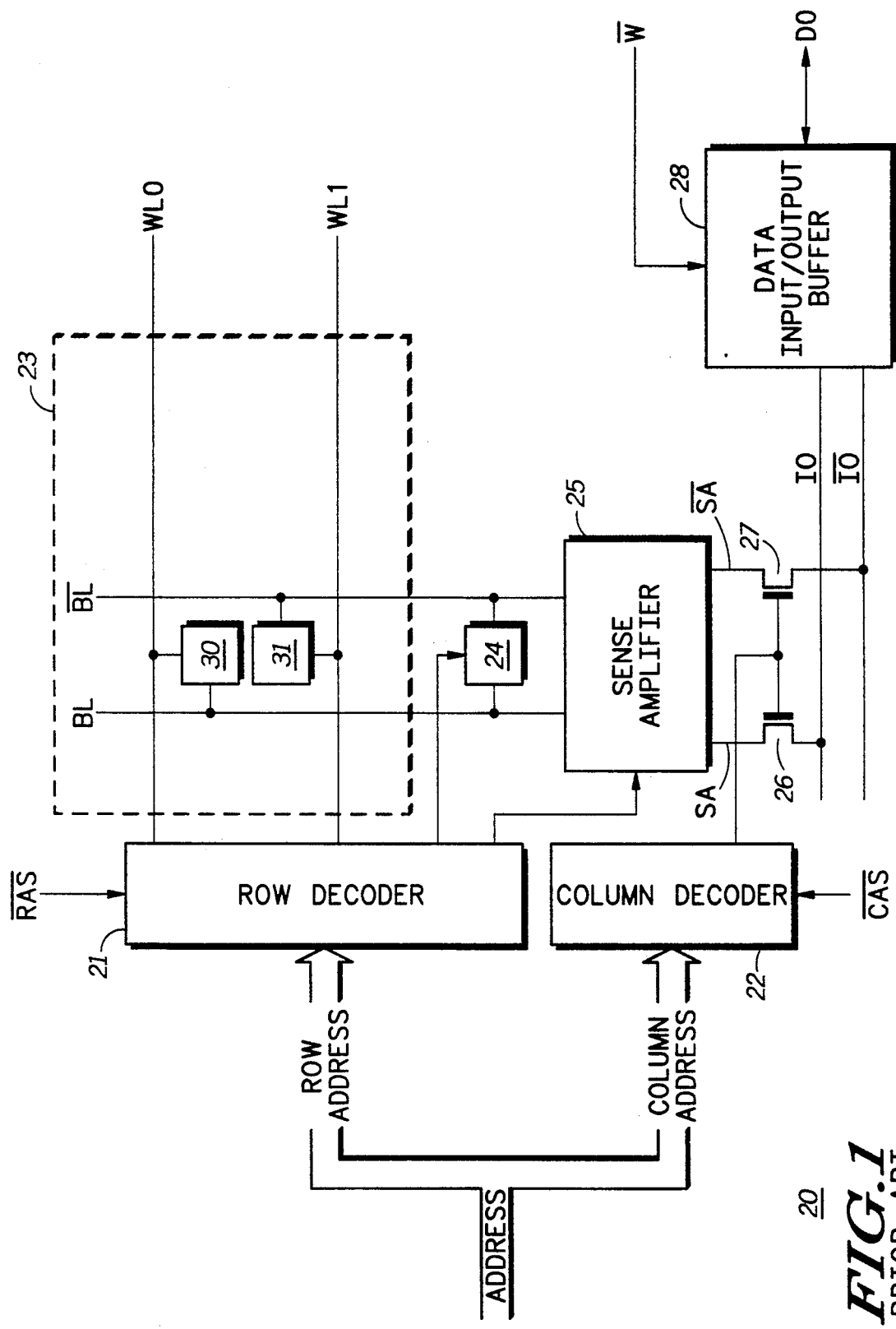
FIG. 1 illustrates in partial block diagram form and partial schematic form a dynamic random access memory known in the prior art.

FIG. 1 illustrates in partial block diagram form and partial schematic form a dynamic random access memory 20 known in the prior art. Note that not all signals and functional blocks of memory 20 are shown in FIG. 1, but only those important in understanding the present invention. Memory 20 includes a row decoder 21, a column decoder 22, a memory array 23, a bit line equalization block 24, a sense amplifier 25, N-channel transistors 26 and 27, and a data input/output buffer 28. Row decoder 21 receives an address labelled "ROW ADDRESS", and latches it in response to a falling edge of a row address strobe signal labelled "RAS". In response, row decoder 21 activates one word line of a plurality of word lines, such as a word line labelled "WL0" or a word line labelled "WL1" in FIG. 1. Row decoder 21 activates bit line sense amplifier 25 in response to signal RAS becoming active, and activates bit line equalization block 24 in response to signal RAS becoming inactive.

In memory array 23, a plurality of memory cells are located at intersections of a plurality of word lines and a plurality of bit line pairs. For example, representative memory cells 30 and 31 are shown in FIG. 1. Memory cell 30 is activated by WL0 and is coupled to a bit line labelled "BL". Memory cell 31 is activated by WL1 and is coupled to a bit line labelled "$\overline{BL}$". Memory array 23 includes memory cells which provide an output to only a single bit line. For example, memory cell 30 provides a voltage only to BL when WL0 is activated. However, a bit stored in memory cell 30 is nonetheless represented as a differential voltage between BL and $\overline{BL}$ because the voltage on $\overline{BL}$ is maintained at a predetermined level. In the illustrated embodiment, when WL0 is activated, $\overline{BL}$ is maintained at approximately one-half of a positive power supply voltage. Thus, if a binary one is stored in memory cell 30, memory cell 30 provides a voltage to BL exceeding one-half of the positive power supply voltage. Conversely, if a binary zero is stored in memory cell 30, memory cell 30 provides a voltage to BL less than one-half of the positive power supply voltage. Thus, memory cell 30 can be considered to be located at the intersection of WL0 and the bit line pair BL and $\overline{BL}$.

When $\overline{RAS}$ becomes active, row decoder 21 activates sense amplifier 25. Sense amplifier 25 is coupled to both BL and $\overline{BL}$, and to corresponding sense amplifier nodes labelled "SA" and "$\overline{SA}$". When activated during a read cycle, sense amplifier 25 increases a small differential voltage between BL and $\overline{BL}$, and increases the voltage on BL and $\overline{BL}$ to either approximately a positive power supply voltage or a negative power supply voltage. When activated during a write cycle, sense amplifier 25 provides additional current to overwrite the contents of a selected memory cell. At the end of an access cycle, signified by signal $\overline{RAS}$ becoming inactive, row decoder 21 activates bit line equalization block 24, which equalizes a voltage between BL and $\overline{BL}$.

Column decoder 22 receives a column address labelled "COLUMN ADDRESS" and latches COLUMN ADDRESS when a column address strobe signal labelled "$\overline{CAS}$" becomes active. Transistor 26 has a first current electrode coupled to node SA, a gate coupled to column decoder 22, and a second current electrode coupled to an input/output signal line labelled "IO". Transistor 27 has a first current electrode connected to node $\overline{SA}$, a gate connected to column decoder 22, and a second current electrode connected to an input/output signal line labelled "$\overline{IO}$". Note that which current electrode becomes the source or drain of transistors 26 and 27 depends upon the voltages applied, and here and in the following discussion the designation of the terminals of such transistors will remain generic. When COLUMN ADDRESS is valid, column decoder 22 activates transistors corresponding to transistors 26 and 27 in a selected column. Data input/output buffer 28 is coupled to IO and $\overline{IO}$ and also to an external data signal labelled "D0", and receives a write signal labelled "$\overline{W}$". During a read cycle, when signal $\overline{W}$ is inactive, data input/output buffer 28 provides D0 as an output signal in response to a differential voltage between IO and $\overline{IO}$. During a write cycle, when signal $\overline{W}$ is active, data input/output buffer 28 receives D0 as an input signal and provides D0 as a differential voltage between IO and $\overline{IO}$.

In memory 20, ROW ADDRESS and COLUMN ADDRESS are multiplexed on a single set of signal lines labelled "ADDRESS". Row decoding takes place first, followed by column decoding, during a cycle. However, once a word line is activated, it need not become deactivated in a subsequent cycle. A cycle in which a word line is activated by row decoding and column decoding takes place two or more times is called page mode. For example, in FIG. 1, row decoder 21 activates WL0. Each memory cell connected to WL0 then couples its contents to a corresponding bit line pair. Row decoder 21 then activates sense amplifiers each coupled to corresponding bit line pairs. In a first subsequent cycle, a first COLUMN ADDRESS is presented to column decoder 22, and $\overline{CAS}$ is asserted. A selected memory cell is then read from or written to. However at the end of the cycle, $\overline{CAS}$ is negated but $\overline{RAS}$ remains active. A subsequent cycle begins when a second COLUMN ADDRESS is presented to column decoder 22 and $\overline{CAS}$ is asserted. Then a read or write cycle is completed. Thus, a page-mode cycle occurs when the same ROW ADDRESS is used for successive accesses, and only COLUMN ADDRESS changes between accesses. Since the row decoding step is eliminated, page-mode accesses are faster.

Figure 2:
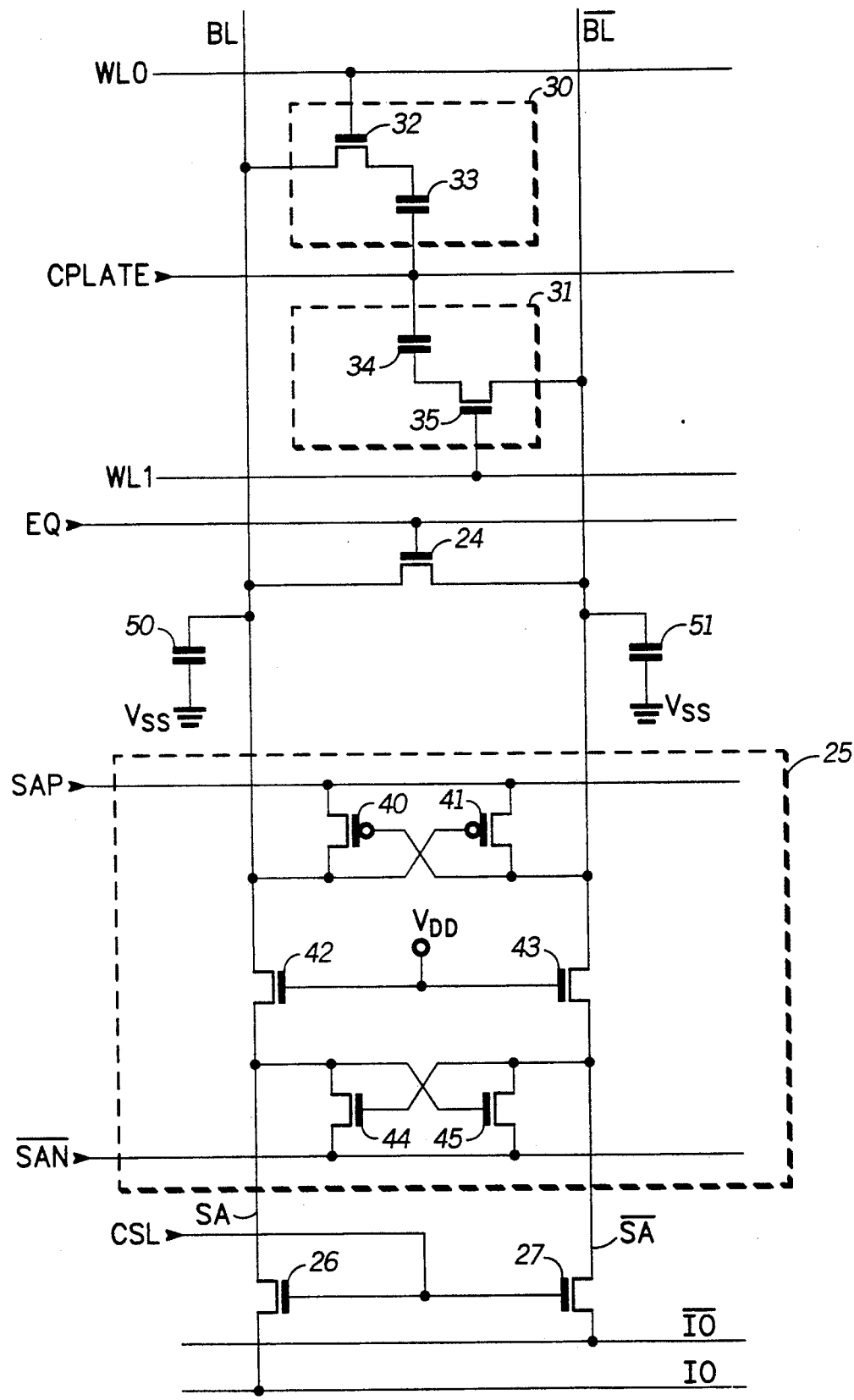
FIG. 2 illustrates in schematic form a portion of the dynamic random access memory of FIG. 1 known in the prior art.

FIG. 2 illustrates in schematic form a portion of the dynamic random access memory FIG. 1 known in the prior art. Elements corresponding to elements in FIG. 1 are similarly numbered. FIG. 2 shows memory cells 30 and 31, bit line equalization block 24 (a single transistor also numbered 24), and sense amplifier 25 in greater detail. Memory cell 30 includes an N-channel transistor 32, and a capacitor 33. Memory cell 31 includes an N-channel transistor 34, and a capacitor 35. Equalization block 24 is shown as being a single N-channel transistor, also numbered 24. Sense amplifier 25 includes P-channel transistors 40 and 41, and N-channel transistors 42, 43, 44, and 45. Two capacitors 50 and 51 are shown coupled to BL and $\overline{BL}$, respectively.

In memory cell 30, transistor 32 has a first current electrode coupled to BL, a gate for receiving WL0, and a second current electrode. Capacitor 33 has a first terminal coupled to the second current electrode of transistor 32, and a second terminal for receiving a voltage labelled "CPLATE". CPLATE is a reference voltage equal to approximately one-half of the positive power supply voltage in relation to the negative power supply voltage, or about 2.5 volts in the illustrated embodiment (with the positive power supply voltage at 5 volts and the negative power supply voltage at zero volts). In memory cell 31, capacitor 34 has a first terminal for receiving CPLATE, and a second terminal. Transistor 35 has a first current electrode connected to the second terminal of capacitor 34, a gate for receiving WL1, and a second current electrode connected to $\overline{BL}$. Transistor 24 has a first current electrode connected to BL, a gate for receiving an equalization signal labelled "EQ", and a second current electrode connected to $\overline{BL}$. In sense amplifier 25, transistor 40 has a source for receiving a signal labelled "SAP", a gate connected to $\overline{BL}$ and a drain connected to BL. Transistor 41 has a source for receiving signal SAP, a gate connected to BL, and a drain connected to $\overline{BL}$. Transistor 42 has a first current electrode connected to BL, a gate connected to a positive power supply voltage terminal labelled "$V_{DD}$", and a second current electrode connected to the first current electrode of transistor 26 at node SA. Transistor 43 has a first current electrode connected to $\overline{BL}$, a gate connected to $V_{DD}$, and a second current electrode connected to the first current electrode of transistor 27 at node $\overline{SA}$. Transistor 44 has a drain connected to the second current electrode of transistor 42 at node SA, a gate connected to the second current electrode of transistor 43, and a source for receiving a sense signal labelled "$\overline{SAN}$". Transistor 45 has a drain connected to the second current electrode of transistor 43 at node $\overline{SA}$, a gate connected to the second current electrode of transistor 42, and a source for receiving signal $\overline{SAN}$. Capacitor 50 has a first terminal connected to BL, and a second terminal connected to a negative power supply voltage terminal labelled "$V_{SS}$". Capacitor 51 has a first terminal connected to $\overline{BL}$, and a second terminal connected to $V_{SS}$. Capacitors 50 and 51 are shown as discrete capacitors to represent the capacitance distributed along BL and $\overline{BL}$, respectively.

Memory cells 30 and 31 each include a single capacitor and a single transistor. For example, consider memory cell 30. If a binary one is stored in memory cell 30, then a voltage of approximately $V_{DD}$ (5 volts in the illustrated embodiment) is applied to the first terminal, resulting in a voltage of approximately 2.5 volts appearing across the first and second terminals thereof. If a binary zero is stored in memory cell 30, then a voltage of approximately $V_{SS}$ (0 volts in the illustrated embodiment) is applied to the first terminal, resulting in a voltage of approximately $-2.5$ volts appearing across the first and second terminals thereof. When word line 32 is activated, transistor 32 is conductive and capacitor 33 couples its charge onto BL. BL is at about 2.5 volts at the beginning of the cycle. Thus, the voltage on BL is increased or decreased in response to a binary one or a binary zero, respectively, stored in memory cell 30. On the other hand, $\overline{BL}$ remains at about 2.5 volts. Thus, a differential voltage between BL and $\overline{BL}$ develops in response to the contents of memory cell 30 when WL0 is activated. The differential voltage is relatively small because as capacitor 33 charges or discharges BL, capacitor 50 receives or provides charge, respectively, to partially offset capacitor 33. It should be apparent that memory cell 31 operates in an analogous fashion when WL1 is active.

In response to ROW ADDRESS and $\overline{RAS}$ as previously described in reference to FIG. 1, row decoder 21 provides signals SAP and $\overline{SAN}$ to activate sense amplifier 25. SAP is active at a logic high of approximately $V_{DD}$, whereas $\overline{SAN}$ is active at a logic low of approximately $V_{SS}$. When sense amplifier 25 is activated, transistors 40 and 41 form a pullup portion thereof. If $\overline{BL}$ is less than BL, then transistor 40 is relatively more conductive than transistor 41, increasing the voltage on BL faster. Transistors 44 and 45 form a pulldown portion of sense amplifier 25. If $\overline{BL}$ is lower than BL, then transistor 45 is relatively more conductive than transistor 44, and reduces the voltage of $\overline{BL}$ faster. Thus, the pullup and pulldown portions work in concert to quickly sense a small differential voltage between BL and $\overline{BL}$ and convert the small differential voltage provided by memory cell 30 into a large different voltage of approximately 5 volts. Transistors 42 and 43 are always conductive and function as resistors, reducing the effect on BL and $\overline{BL}$ of the capacitance added by transistors 44, 45, 26, and 27.

There are several problems associated with the portion of memory 20 shown in FIG. 2 which result from performing page-mode cycles. First, the write speed is very slow, because data input/output buffer 28 of FIG. 1 must overcome not only sense amplifier 25 but also the charge stored in bit lines BL and $\overline{BL}$ (illustrated by capacitors 50 and 51, respectively), through the relatively-large resistors formed by transistors 42 and 43. Second, subthreshold leakage currents for the unselected memory cells coupled to the activated bit line are high, because the bit lines are provided close to positive and negative power supply voltages. For example, assume WL0 is active, but bit lines BL and $\overline{BL}$ are not selected by column decoding. Sense amplifier 25 senses a small voltage provided by memory cell 30 and provides voltages on BL and $\overline{BL}$ at either the positive or the negative power supply voltage. The extreme voltages on BL and $\overline{BL}$ causes transistors 32 and 35 in memory cells 30 and 31, respectively, to have an appreciable leakage current, since leakage current is proportional to the threshold voltage and the drain-to-source voltage. The leakage current works to discharge a corresponding storage capacitor of the memory cell. By the end of a long page-mode cycle, the cumulative leakage may be large enough to cause the stored memory bit value to be lost. This destruction of data due to leakage increases the soft error rate (SER) of the memory. Third, during multiple read and write cycles in page mode, power consumption is high because parasitic bit line capacitances of capacitors 50 and 51 are repeatedly charged and discharged.

Figure 3:
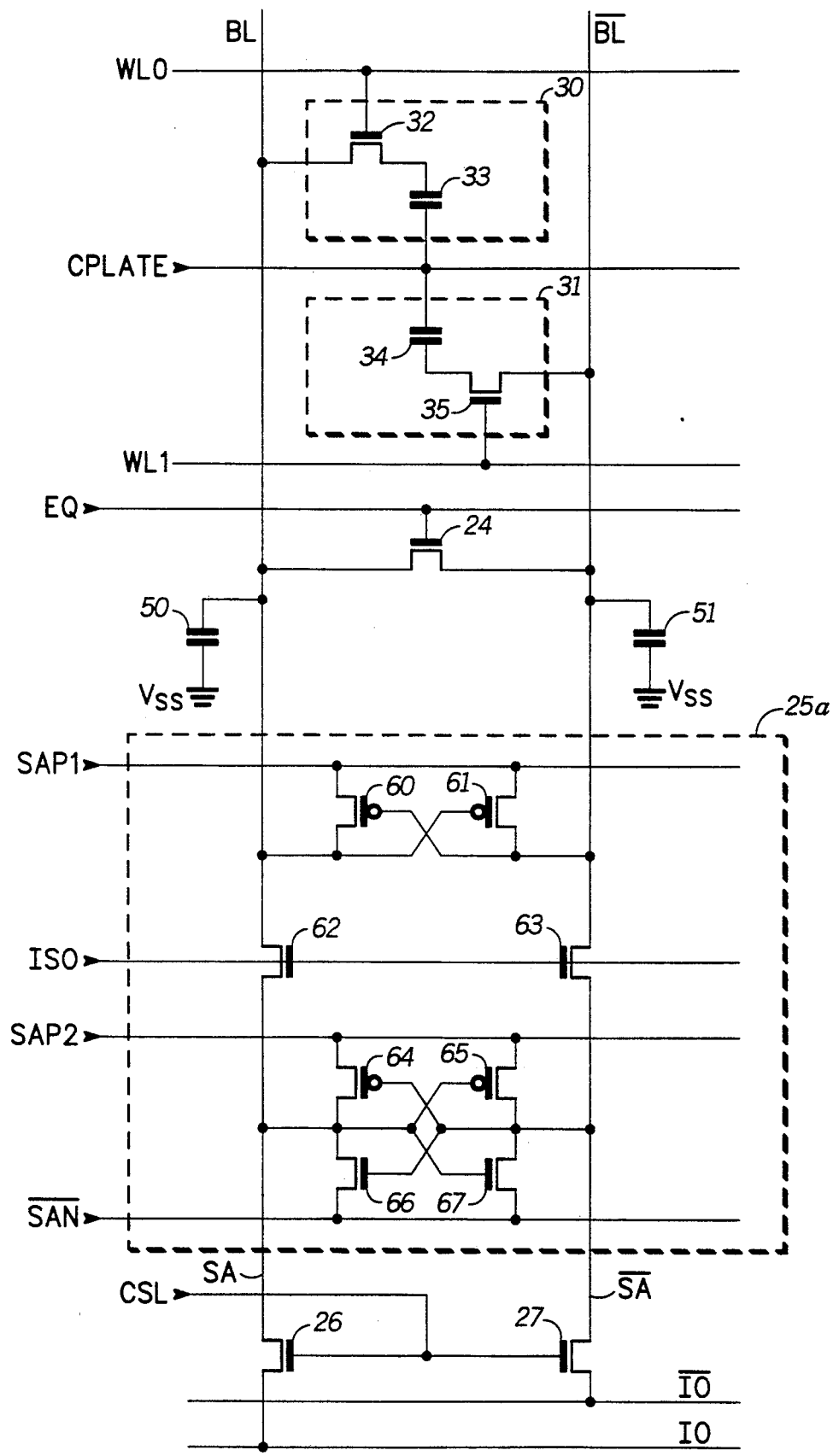
FIG. 3 illustrates in schematic form a portion of a dynamic random access memory corresponding to the portion of FIG. 2, in accordance with the present invention.

FIG. 3 illustrates in schematic form a portion of a dynamic random access memory corresponding to the portion of FIG. 2, in accordance with the present invention. As before, corresponding elements are similarly numbered. The only difference is that sense amplifier 25a in FIG. 3 replaces sense amplifier 25 of FIG. 2. Sense amplifier 25a includes P-channel transistors 60 and 61, N-channel transistors 62 and 63, P-channel transistors 64 and 65, and N-channel transistors 66 and 67. Transistor 60 has a source for receiving a signal labelled "SAP1", a gate connected to $\overline{BL}$, and a drain connected to BL. Transistor 61 has a source for receiving SAP1, a gate connected BL, and a drain connected to $\overline{BL}$. Transistor 62 has a first current electrode connected to BL, a gate for receiving a signal labelled "ISO", and a second current electrode connected to the first current electrode of transistor 26. Transistor 63 has a first current electrode connected to $\overline{BL}$, a gate for receiving signal ISO, and a second current electrode connected to the first current electrode of transistor 27. Transistor 64 has a source for receiving a signal labelled "SAP2", a gate connected to the second current electrode of transistor 63, and a drain connected to the second current electrode of transistor 62. Transistor 65 has a source for receiving SAP2, a gate connected to the second current electrode of transistor 62, and a drain connected to the second current electrode of transistor 63. Transistor 66 has a drain connected to the second current electrode of transistor 62, a gate connected to the second current electrode of transistor 63, and a source for receiving signal $\overline{SAN}$. Transistor 67 has a first current electrode coupled to the second current electrode of transistor 63, a gate coupled to the second current electrode of transistor 62, and a second current electrode for receiving signal $\overline{SAN}$.

Sense amplifier 25a performs two functions. First, sense amplifier 25a senses a differential voltage between BL and $\overline{BL}$ and latches the sensed differential voltage when activated. The latched voltage may then be read and written during subsequent cycles in page mode. When the page-mode cycles are complete, as indicated by $\overline{RAS}$ becoming inactive, the latched voltage is coupled to the selected memory cell to update and refresh the bit stored therein. Second, sense amplifier 25a isolates BL and $\overline{BL}$ from the remainder of the sense amplifier so that equalization of BL and $\overline{BL}$ may begin.

Figure 4:
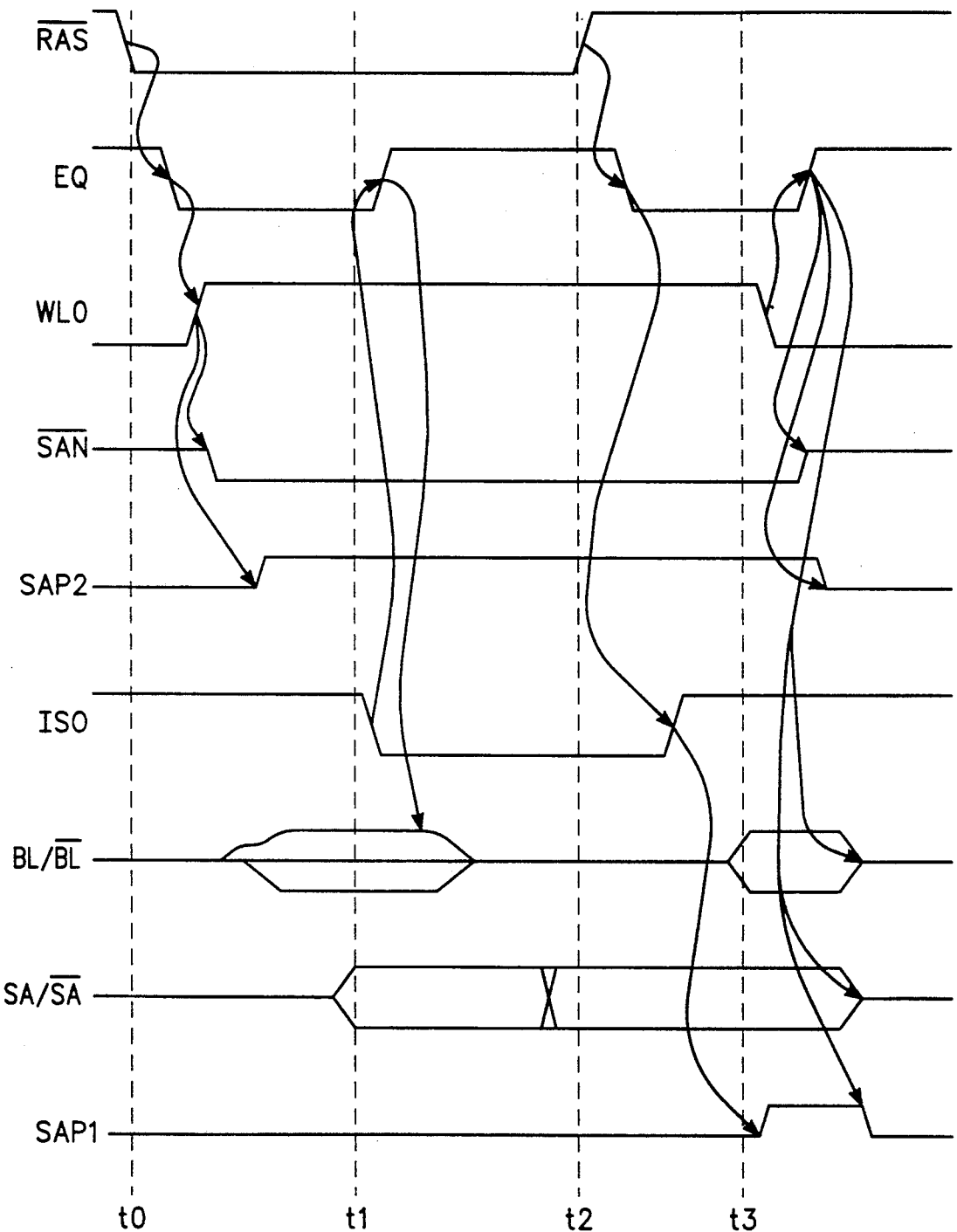
FIG. 4 illustrates a timing diagram of the signals pertinent to FIG. 3.

FIG. 4 illustrates a timing diagram of the signals pertinent to FIG. 3. Referring now to FIG. 4 in conjunction with FIG. 3, after signal $\overline{RAS}$ becomes active at a time labelled "t0", indicating a valid ROW ADDRESS, signal EQ becomes inactive, allowing BL and $\overline{BL}$ to separate in voltage. A short time later a word line, such as WL0, becomes active. When WL0 becomes active, memory cell 30 increases or decreases a voltage on BL in response to a bit stored therein. Note that in FIG. 4 signals BL and $\overline{BL}$ are illustrated as separating from the precharge voltage. However, only a single bit line voltage changes, the other bit line voltage remains at the precharge voltage, and a differential voltage between BL and $\overline{BL}$ now represents the bit stored in memory cell 30. ISO is at a logic high, causing transistors 62 and 63 to be conductive and to function as resistors. SAP2 becomes a logic high and $\overline{SAN}$ becomes a logic low to activate sense amplifier 25a. Transistors 64, 65, 66, and 67 in concert sense a small differential voltage between BL and $\overline{BL}$ and increase the differential voltage to approximately $V_{DD}$ or $V_{SS}$ around a time labelled "t1". Shortly thereafter, ISO becomes inactive, isolating transistors 64, 65, 66, and 67 from BL and $\overline{BL}$. Thereafter, EQ becomes active, making transistor 24 conductive and coupling BL and $\overline{BL}$ together. Thus, the timing of signals shown in FIG. 4 results from signal $\overline{RAS}$ becoming active.

Signals $\overline{SAN}$, SAP1, and SAP2 are precharged to ($V_{DD}/2$) or about 2.5 volts. In response to $\overline{RAS}$ becoming active, signals $\overline{SAN}$ and SAP2 become active and transistors 64, 65, 66, and 67 become conductive and together also act as a latch, storing the value of memory cell 30 therein. Since all columns have corresponding sense amplifiers latching voltages of memory cells along WL0, memory 20 functions as an N-by-one static random access memory (SRAM) for the remainder of the page-mode cycle, where N is the number of columns. In subsequent cycles in page mode, the value stored therein may be read or written without affecting the voltage on BL and $\overline{BL}$. Whether the stored value is provided externally as data signal D0 or is overwritten depends, of course, on the state of $\overline{W}$ and COLUMN ADDRESS.

At the end of the page-mode cycle at a time labelled "t2", $\overline{RAS}$ is negated. EQ becomes inactive, ISO again becomes active, coupling SA and $\overline{SA}$ to BL and $\overline{BL}$, respectively. The value latched by sense amplifier 25a, which may have been modified during the page-mode cycle, is then provided to memory cell 30. Shortly after ISO becomes active, SAP1 becomes active at a time labelled "t3" to increase the voltage on the bit line which is to be provided a logic high voltage to approximately $V_{DD}$. The bit line to be provided as a logic low is at approximately $V_{SS}$. Thus, at the end of the page-mode cycle, the value of the selected memory cell is updated and the charge of an unmodified memory cell refreshed.

There are at least three advantages with the use of sense amplifier 25a to the page-mode memory. First, the speed of a write cycle is improved, because data input/output buffer 28 of FIG. 1 need only overcome the sense amplifier and a parasitic capacitance associated therewith; the capacitance of the bit lines (capacitors 50 and 51) and the capacitance of the memory cell coupled to the selected word line (for example, capacitor 33 of memory cell 30 when WL0 is active) is isolated therefrom by transistors 62 and 63. Second, during page mode, BL and $\overline{BL}$ are almost equalized at one-half of the difference between $V_{DD}$ and $V_{SS}$, or about 2.5 volts. Thus, the subthreshold leakage of unselected memory cells is reduced by an order of magnitude and SER is reduced. Third, power consumption of the page-mode read-modify-write cycle is reduced because data input/output buffer 28 need only charge and discharge the parasitic capacitance of the sense amplifier latches during the write portion of the read-modify-write cycle, instead all the capacitance of the bit line in a traditional page-mode cycle shown in FIG. 2.

Figure 5:
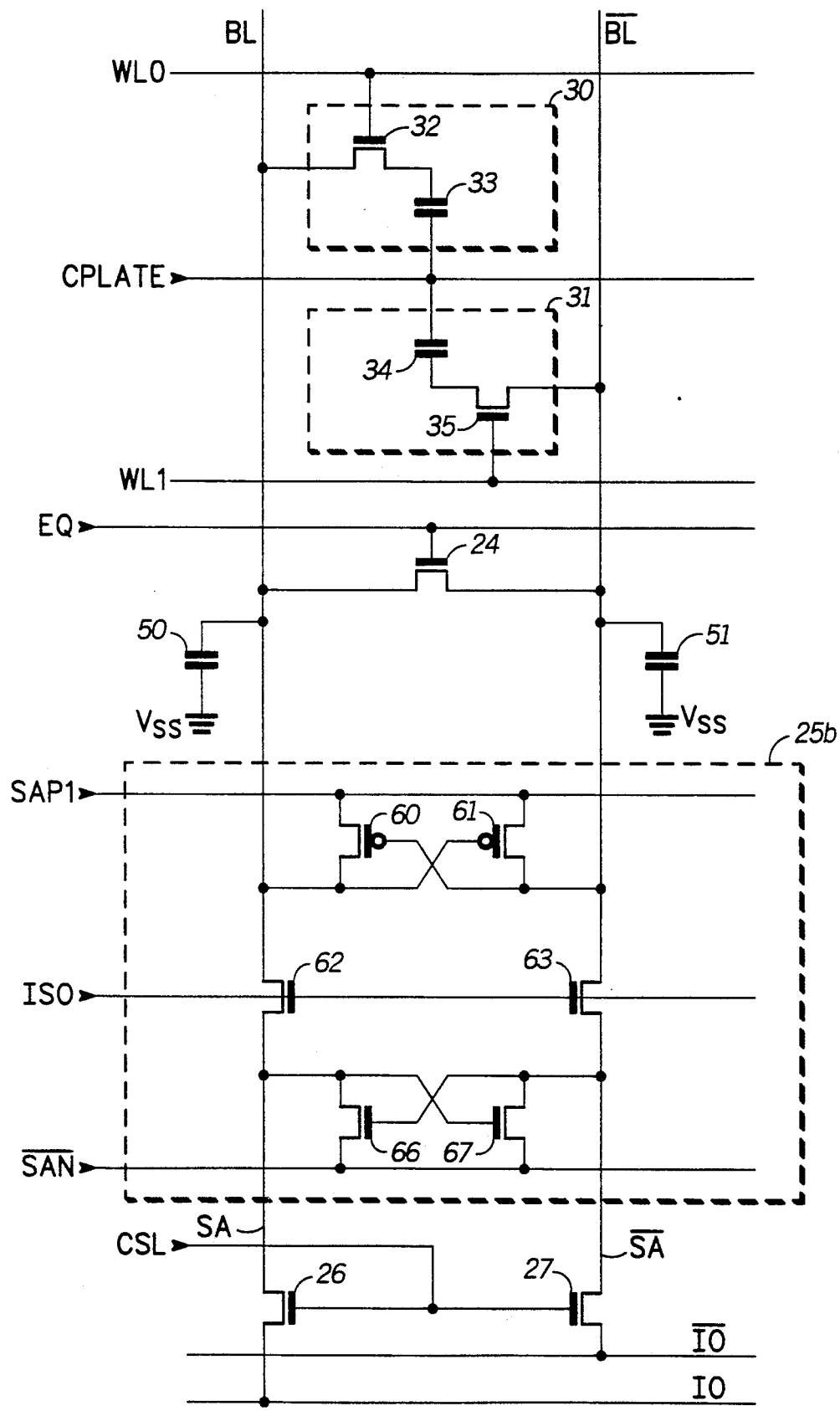
FIG. 5 illustrates in schematic form the portion of the dynamic random access memory of FIG. 3 in accordance with a second embodiment of the present invention.

FIG. 5 illustrates in schematic form the portion of the dynamic random access memory of FIG. 3 in accordance with a second embodiment of the present invention. As before, elements corresponding to elements in FIG. 3 are similarly numbered. The only difference between FIG. 5 and FIG. 3 is that in FIG. 5 sense amplifier 25b replaces sense amplifier 25a of FIG. 3. The only difference between sense amplifier 25b of FIG. 5 and sense amplifier 25a of FIG. 3 is that transistors 64 and 65 are omitted in sense amplifier 25b. The circuit area required for sense amplifier 25b is less than that of sense amplifier 25a. However, the timing of signal ISO becoming active and inactive becomes more critical because improper timing may introduce a very low equilibrium bit line voltage. The low equilibrium bit line voltage results because signal $\overline{SAN}$ alone becomes active during a cycle; at the end of the cycle, the bit lines are equalized in between one bit line at a voltage of ($V_{DD}/2$), and the other, low bit line at approximately $V_{SS}$. The process may be repeated in consecutive page mode cycles, further lowering the equilibrium voltage. The danger of a low equilibrium bit line voltage is during the write portion of page-mode cycle. If the bit line equilibrium voltage is below one N-channel threshold, labelled "$V_T$", then when transistors 62 and 63 become conductive, the high sense line, either SA or $\overline{SA}$, may be pulled down to the equilibrium voltage due to mismatch of sense amplifier parasitic capacitance in relation to the bit line capacitance. Thus, both transistors 66 and 67 may be simultaneously nonconductive and the data bit latched in the sense amplifier is erased. To avoid the low equilibrium voltage, ISO must become inactive while sense amplifier 25b is sensing the data so that neither BL nor $\overline{BL}$ are pulled down all the way to $\overline{SAN}$ by sense amplifier 25b.

Figure 6:
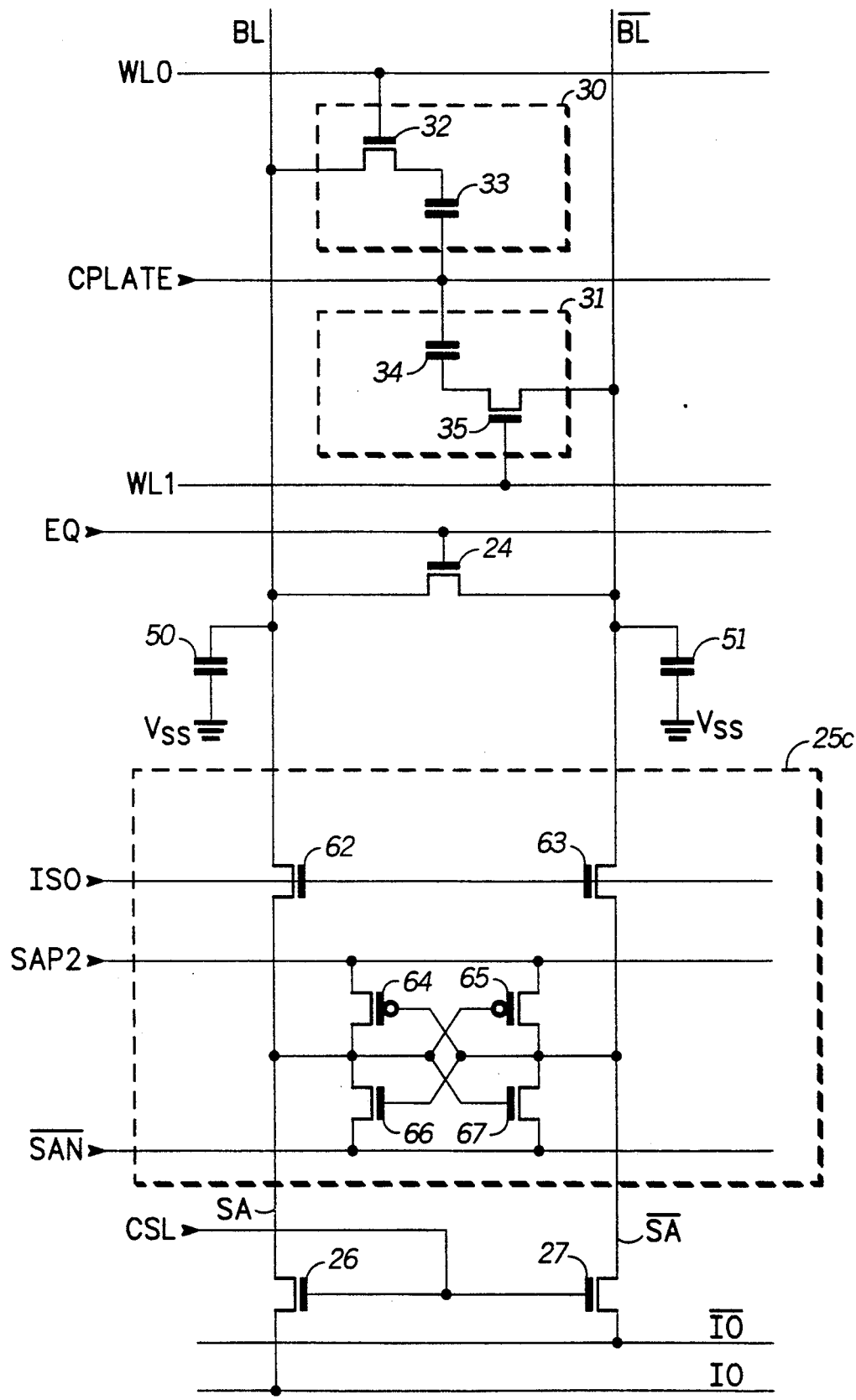
FIG. 6 illustrates in schematic form the portion of the dynamic random access memory of FIG. 3 in accordance with a third embodiment of the present invention.

FIG. 6 illustrates in schematic form the portion of the dynamic random access memory of FIG. 3 in accordance with a third embodiment of the present invention. As before, elements corresponding to elements in FIG. 3 are similarly numbered. The only difference between FIG. 6 and FIG. 3 is that in FIG. 6 sense amplifier 25c replaces sense amplifier 25a of FIG. 3. Additionally, it is seen that the only difference between sense amplifier 25c of FIG. 5 and sense amplifier 25a of FIG. 3 is that transistors 60 and 61 are omitted in sense amplifier 25c. Sense amplifier 25c requires signal ISO to be bootstrapped above $V_{DD}$ during the write portion of a page-mode cycle so that a proper logic high may be written into the selected memory cell. However, a complex bootstrap circuit is required, and the danger of high voltages for such reliability problems as thin gate oxide rupture and latchup is increased.

It should be apparent by now that a memory with improved performance has been described. The memory includes memory cells located at intersections of word lines and differential bit line pairs. A row decoder activates a word line in response to a row address. A sense amplifier coupled to each bit line pair then increases the small differential voltage of the bit line pair to positive and negative power supply voltages. The sense amplifier is then isolated from the bit lines so that the bit lines are equalized. The contents of memory cells are stored in corresponding sense amplifiers, and the memory functions as a by-one memory during the remainder of the page-mode cycle. At the end of the page-mode cycle, the sense amplifiers are recoupled to the bit lines to update modified data and refresh the charge stored in the memory cells. Performance is improved in at least three ways, including improved write speed, decreased SER by reducing subthreshold leakage, and reduced power consumption.

While the invention has been described in the context of a preferred embodiment, it will be apparent to those skilled in the art that the present invention may be modified in numerous ways and may assume many embodiments other than that specifically set out and described above. For example, the memory of the illustrated embodiments has a by-one data organization. However, it is possible to include several by-one blocks to increase the width of the memory. Also, the illustrated embodiments included CMOS circuitry; however a design using bipolar or BICMOS technology or other types of transistor technology is also possible. Accordingly, it is intended by the appended claims to cover all modifications of the invention which fall within the true spirit and scope of the invention.

I claim:

1. A dynamic random access memory comprising:
   a memory cell activated by a word line, and providing a differential voltage to true and complement bit lines in response to a bit stored therein when activated;
   isolation means for coupling said true and complement bit lines to true and complement sense lines, respectively, and for isolating said true and complement bit lines from said true and complement sense lines a predetermined time after a start of an access cycle;
   a first sense amplifier coupled to said true and complement sense lines, for latching a differential voltage between said true and complement sense lines, in response to said access cycle; and
   a second sense amplifier coupled to said true and complement bit lines, for latching a differential voltage between said true and complement sense lines in response to a termination of said access cycle.

2. The dynamic random access memory of claim 1 wherein said first sense amplifier comprises:
   a first transistor having a first current electrode for receiving a first sense enable signal, a control electrode coupled to said complement sense line, and a second current electrode coupled to said true sense line;
   a second transistor having a first current electrode coupled to said true sense line, a control electrode coupled to said complement sense line, and a second current electrode for receiving a second sense enable signal;
   a third transistor having a first current electrode for receiving said first sense enable signal, a control electrode coupled to said true sense line, and a second current electrode coupled to said complement sense line; and
   a fourth transistor having a first current electrode coupled to said complement sense line, a control electrode coupled to said true sense line, and a second current electrode for receiving said second select signal.

3. The dynamic random access memory of claim 1 wherein said second sense amplifier comprises:
   a fifth transistor having a first current electrode for receiving a third sense enable signal, a control electrode coupled to said complementary bit line, and a second current electrode coupled to said true bit line; and
   a sixth transistor having a first current electrode for receiving said third sense enable signal, a control electrode coupled to said true bit line, and a second current electrode coupled to said complementary bit line.

4. The dynamic random access memory of claim 1 further comprising column decoding means, for coupling said true and complement sense lines to true and complement input/output lines in response to a column address.

5. In a dynamic random access memory, the dynamic random access memory including a plurality of memory cells activated by a word line, and providing a differential voltage to corresponding true and complement bit lines of a plurality of bit line pairs in response to a bit stored therein, a method of improving a performance of the dynamic random access memory during a series of page-mode cycles, comprising the steps of:
   activating the word line at a start of the series of page-mode cycles;
   providing a bit stored in each memory cell to corresponding true and complement bit lines;
   latching a differential voltage of each true and complement bit line in a first sense amplifier coupled to corresponding true and complement sense lines, respectively;
   isolating each true and complement bit line from said corresponding true and complement sense lines;
   equalizing a voltage between each true and complement bit line;
   selecting bit line pairs in response to successive column addresses;
   coupling true and complement sense lines corresponding to said selected bit line pairs to true and complement input/output signal lines, respectively;
   recoupling each true and complement sense line to corresponding true and complement bit lines, respectively, at an end of the series of page-mode cycles; and
   providing voltages to said true and complement bit lines indicative of a logic state stored in said first sense amplifier at said end of the series of page-mode cycles.

6. The method of claim 5 wherein said step of providing voltages to said true and complement bit lines further comprises the step of latching a differential voltage of each true and complement sense line in a second sense amplifier coupled to said corresponding true and complement bit lines.

7. A dynamic random access memory comprising:
   a plurality of word lines;
   a plurality of differential bit lines pairs intersecting said plurality of word lines;
   a plurality of memory cells located at intersections of said word lines and said bit line pairs, each memory cell providing a bit stored therein as a differential voltage between true and complement bit lines of a corresponding differential bit line pair when a word line to which said memory cell is coupled is activated;

row decoding means for activating a word line in response to a row address;

first sense means for sensing a differential voltage between each of said true and complement bit lines of said differential bit line pairs and for latching said sensed differential voltage onto corresponding true and complement sense lines during an access cycle;

isolation means coupled to said plurality of differential bit line pairs and to said first sense means, for isolating said differential bit line pairs from said first sense means a predetermined time after a start of said access cycle; and second sense means coupled to each of said true and complement bit line pairs, for sensing a differential voltage between each true and complement sense line pair and for latching said differential voltage onto a corresponding true and complement bit line pair in response to a termination of said access cycle.

8. The dynamic random access memory of claim 7 further comprising equalization means, coupled to said plurality of differential bit line pairs, for coupling together true and complement bit lines of each differential bit line pair after said isolation means isolates each bit line pair from said sense means.

9. The dynamic random access memory of claim 8 further comprising:

column means for coupling true and complement sense lines selected by a column address to an input/output signal pair in response to a column address; and input/output means coupled to said input/output signal pair, for receiving a data bit and providing said data bit to said input/output signal pair in response to a write cycle, and for providing said data bit in response to a differential voltage between true and complement signal lines of said input/output signal pair in response to a read cycle.

10. The dynamic random access memory of claim 7 wherein said isolation means couples each bit line to a corresponding sense line in response to an isolation signal.

11. The dynamic random access memory of claim 10 wherein said first sense means comprises a plurality of sense amplifiers each coupled to corresponding true and complement sense lines and to said column decoding means, each sense amplifier comprising:

a first transistor having a first current electrode for receiving a first sense enable signal, a control electrode coupled to the complement sense line, and a second current electrode coupled to the true sense line;

a second transistor having a first current electrode coupled to the true sense line, a control electrode coupled to the complement sense line, and a second current electrode for receiving a second sense enable signal;

a third transistor having a first current electrode for receiving said first sense enable signal, a control electrode coupled to the true sense line, and a second current electrode coupled to the complement sense line; and a fourth transistor having a first current electrode coupled to the complement sense line, a control electrode coupled to the true sense line, and a second current electrode for receiving said second select signal.

12. The dynamic random access memory of claim 10 wherein said isolation means comprises:

a first transistor having a first current electrode coupled to said true bit line, a control electrode for receiving said isolation signal, and a second current electrode coupled to said true sense line; and a second transistor having a first current electrode coupled to said complement bit line, a control electrode for receiving said isolation signal, and a second current electrode coupled to said complement sense line.

* * * * *